United States Patent
Altaf et al.

(10) Patent No.: US 12,325,326 B2
(45) Date of Patent: Jun. 10, 2025

(54) METHOD FOR CONTROLLING ELECTRICAL CONNECTION OF BATTERY PACKS

(71) Applicant: VOLVO TRUCK CORPORATION, Gothenburg (SE)

(72) Inventors: Faisal Altaf, Västra Frölunda (SE); Adam Josefsson, Gothenburg (SE); Jonas Enerbäck, Gothenburg (SE); Bassem Farag, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 742 days.

(21) Appl. No.: 17/597,257

(22) PCT Filed: Jul. 4, 2019

(86) PCT No.: PCT/EP2019/068021
§ 371 (c)(1),
(2) Date: Dec. 30, 2021

(87) PCT Pub. No.: WO2021/001046
PCT Pub. Date: Jan. 7, 2021

(65) Prior Publication Data
US 2022/0314835 A1 Oct. 6, 2022

(51) Int. Cl.
*H02J 7/00* (2006.01)
*B60L 58/13* (2019.01)
(Continued)

(52) U.S. Cl.
CPC ............. *B60L 58/19* (2019.02); *B60L 58/13* (2019.02); *G01R 31/3648* (2013.01); *B60L 2200/18* (2013.01); *B60L 2240/547* (2013.01)

(58) Field of Classification Search
USPC .......................................... 320/117
See application file for complete search history.

(56) References Cited

U.S. PATENT DOCUMENTS

| 7,755,331 B2 | 7/2010 | Kawahara et al. |
| 10,259,337 B2 | 4/2019 | Alser et al. |
| (Continued) | | |

FOREIGN PATENT DOCUMENTS

| EP | 2961023 A1 | 12/2015 |
| GB | 2550954 A | 12/2017 |
| (Continued) | | |

OTHER PUBLICATIONS

International Search Report and Written Opinion dated Feb. 28, 2020 in corresponding International PCT Application No. PCT/EP2019/068021, 10 pages.
(Continued)

*Primary Examiner* — Samuel Berhanu
(74) *Attorney, Agent, or Firm* — Venable LLP; Jeffri A. Kaminski

(57) ABSTRACT

A method for controlling electrical connection of at least two battery packs (202, 203) of an energy storage System (200) of a vehicle (201) to a common load during operation of the vehicle, each one of the battery packs being connectable to the load via at least one respective switching device, the method comprising: —receiving measurement data relating to current operating conditions of the energy storage System, —based on at least the measurement data, estimating at least one battery state of each one of the battery packs, wherein said at least one battery state is at least one of an open circuit voltage and a state of charge, —based on the estimated at least one battery state of each one of the battery packs, controlling electrical connection of each battery pack to the load via the at least one respective switching device.

10 Claims, 2 Drawing Sheets

(51) Int. Cl.
*B60L 58/19* (2019.01)
*G01R 31/36* (2020.01)

(56) References Cited

U.S. PATENT DOCUMENTS

| | | |
|---|---|---|
| 2007/0247106 A1 | 10/2007 | Kawahara et al. |
| 2010/0185405 A1* | 7/2010 | Aoshima ............ B60L 58/22 702/63 |
| 2012/0083948 A1 | 4/2012 | Tate et al. |
| 2012/0319657 A1 | 12/2012 | Ke et al. |
| 2014/0103859 A1 | 4/2014 | Nishi |
| 2014/0265600 A1 | 9/2014 | Tsukamoto et al. |
| 2016/0052417 A1 | 2/2016 | Zhou et al. |
| 2017/0166075 A1 | 6/2017 | Hong et al. |
| 2019/0052119 A1 | 2/2019 | Hendrix et al. |
| 2019/0123568 A1 | 4/2019 | Kaneko |
| 2019/0299811 A1 | 10/2019 | Bryngelsson et al. |
| 2020/0376968 A1 | 12/2020 | Wang et al. |

FOREIGN PATENT DOCUMENTS

| | | |
|---|---|---|
| GB | 2550955 A | 12/2017 |
| WO | 2013186209 A2 | 12/2013 |
| WO | 2013186209 A3 | 5/2014 |

OTHER PUBLICATIONS

International Preliminary Report on Patentablility dated Oct. 13, 2021 in corresponding International PCT Application No. PCT/EP2019/068021, 24pages.
S. Lee, J. Kim, M. Ha and H. Song, "Inrush Current Estimation for Hot Swap of the Parallel Connected Large Capacity Battery Pack," 2018 IEEE Energy Conversion Congress and Exposition (ECCE), 2018, pp. 2489-2492, doi: 10.1109/ECCE.2018.8558163.
European Office Action dated Aug. 7, 2023 in corresponding European Patent Application No. 19736689.1, 29 pages.

* cited by examiner

METHOD FOR CONTROLLING ELECTRICAL CONNECTION OF BATTERY PACKS

CROSS-REFERENCE TO RELATED APPLICATIONS

This application is a U.S. National Stage application of PCT/EP2019/068021, filed Jul. 4, 2019, and published on Jan. 7, 2021, as WO 2021/001046 A1, all of which is hereby incorporated by reference in its entirety.

TECHNICAL FIELD

The invention relates to a method for controlling electrical connection of at least two battery packs of an energy storage system of a vehicle. The invention further relates to a computer program, a computer readable medium, a control unit, an energy storage system, and a vehicle.

The invention can be applied in any type of hybrid vehicles or electrical vehicles, such as partly or fully electrical vehicles. Although the invention will be described with respect to an electrical bus, the invention is not restricted to this particular vehicle, but may also be used in other hybrid or electrical vehicles such as electrical trucks, electrical construction equipment, and electrical cars. The invention may also be applied in any other type of electrical vehicle such as electrical powered construction equipment, electrical working machines e.g. wheel loaders, articulated haulers, dump trucks, excavators and backhoe loaders etc.

BACKGROUND

Batteries are becoming a more common source of power for providing propulsion for vehicles. Such batteries are often rechargeable batteries and typically include a number of battery cells that may be connected in series or in parallel forming a complete battery pack for the vehicle. Typically, a battery pack includes a number of battery cells.

To increase the energy storage capacity and available electric power of an electrically operated vehicle, more than one battery pack may be provided in the energy storage system. Consequently, two or more battery packs may be simultaneously connected to a load, such as an electric motor of the vehicle. By connecting several battery packs in parallel, the available power for propulsion of the vehicle may be increased. However, if the battery packs are imbalanced upon connection, circulation currents may arise between the battery packs and lead to unwanted current spikes. In addition, the circulating currents may reduce power ability of overall energy storage system for vehicle propulsion. Therefore, such circulating currents and spikes should be avoided.

One way of preventing circulation currents is to measure terminal voltage of the battery packs, and based thereon decide whether to connect the battery packs or not, since a large difference in terminal voltage may indicate that a circulation current may result upon connection. However, during driving, when at least one of the battery packs is already connected to the load, the measurable terminal voltage may not provide a reliable means for determining whether a circulation current will arise upon connection of the battery packs. Hence, it would be desirable to provide a more reliable way of ensuring that the battery packs may be connected without risking detrimental current spikes.

SUMMARY

A first objective of the invention is to provide an in at least some aspect improved means for controlling electrical connection of at least two battery packs of an energy storage system of a vehicle, and/or to provide an in at least some aspect improved energy storage system for a vehicle. In particular, it is an objective to provide a more reliable method for controlling electrical connection of at least two battery packs during driving of an electrified vehicle. Another objective is to provide such a method by means of which an improved driving experience as well as improved safety and battery lifetime can be achieved. At least the first objective is at least partly achieved by a method according to claim 1.

According to a first aspect of the invention, a method for controlling electrical connection of at least two battery packs of an energy storage system of a vehicle to a common load during operation of the vehicle is provided, each one of the at least two battery packs being connectable to the load via at least one respective switching device, the method comprising:

receiving measurement data relating to current operating conditions of the energy storage system, based on at least the measurement data, estimating at least one battery state of each one of the at least two battery packs, wherein said at least one battery state is at least one of an open circuit voltage and a state of charge, based on the estimated at least one battery state of each one of the at least two battery packs, controlling electrical connection of each battery pack to the load via the at least one respective switching device.

By means of the proposed method, connection of the at least two battery packs to a load, and in particular connection of at least one battery pack not already connected to the load to which at least one other battery pack is already connected, is controlled based on estimations of at least one battery state of the battery packs. By using estimations of the battery state(s), i.e. state of charge (SOC) and/or open circuit voltage (OCV), it is possible to predict how the battery packs will behave upon connection to the common load. For example, if the estimation shows that an estimated battery state of a disconnected battery pack differs from that of an already connected battery pack, it may be decided to hold off with connection of the disconnected battery pack. The SOC and the OCV are both indicative of how the battery packs will behave upon connection. Thus, there is no need to attempt to connect the battery packs before it is deemed suitable to do so based on the estimated battery state(s). An improved driving experience may thereby be provided, since unsuccessful attempts to connect the battery packs normally result in a temporarily lowered amount of available power for e.g. propulsion of the vehicle. Moreover, unsuccessful connection attempts may have a harmful effect on the lifetime of the battery packs and the proposed method may therefore serve to improve battery lifetime.

In comparison with prior art methods using terminal voltage measurements to decide whether to connect two or more battery packs, the proposed method provides a more reliable basis for taking this decision during driving, since the terminal voltage may not give a true indication of e.g. the SOC and the OCV of a battery pack under load. Connecting two battery packs with different SOC and OCV levels may lead to creation of unwanted circulation currents and should therefore be avoided.

By means of the proposed method, it may also be possible to predict in advance if it will be possible at all to connect two battery packs during a current drive cycle for a given battery state imbalance between the battery packs. This information can be used to adapt the driving according to the number of battery packs that are possible to connect. It may also enable predictive maintenance or balancing of a multi-battery pack system by generating a fault code in time.

The battery packs are preferably to be connected in parallel. Each battery pack may, via the respective switching device, be connected to the load. Thus, upon connection of two or more battery packs to the load, the battery packs connected to the load will also be connected to one another.

By "current operating conditions" is herein intended "present operating conditions".

According to one embodiment, controlling electrical connection of the at least two battery packs comprises:
based on said estimated at least one battery state of each one of the at least two battery packs, determining if a predetermined connection condition is fulfilled, wherein the at least two battery packs are only electrically connected if the connection condition is considered to be fulfilled.

This provides a straight-forward way of determining if the battery packs may be connected or not. Information regarding whether the connection condition is fulfilled can also be used to adapt the driving accordingly if connection is not possible. It may also enable predictive maintenance or balancing of multi-battery systems by generating a fault code in time. The connection condition may be related to SOC and/or OCV, or to a battery property derivable from SOC and/or OCV, such as to a predicted possible circulation current that may arise upon connection of two battery packs having different SOC levels. In case several battery packs are to be connected to the load, to which at least one battery pack is already connected, each disconnected battery pack should be considered separately and the battery packs should be connected one by one as the connection condition for each battery pack is considered fulfilled. It is also possible to connect them simultaneously if all conditions are satisfied simultaneously.

According to one embodiment, the connection condition is considered to be fulfilled if, for connection of a first and a second battery pack of the at least two battery packs, the at least one battery state of the first battery pack does not differ by more than a predefinable threshold from the at least one battery state of the second battery pack. In this embodiment, the second battery pack may initially be disconnected, and the first battery pack may initially be connected to the load. For connection of the second battery pack, it is checked if the battery state of this second battery pack differs from the battery state of the first battery pack by more than the threshold.

According to one embodiment, a value of the predefinable threshold is selected in dependence on a state of charge operating point of at least one of said battery packs that is already connected to the load. The value may e.g. be selected from a look-up table or map describing a relation between the SOC operating point, a SOC or OCV imbalance between the battery packs, and a magnitude of a circulation current. For example, at a SOC operating point in the middle of the SOC window, a relatively larger SOC imbalance may be accepted than at relatively higher or lower SOC operating points, since the same SOC imbalance may lead to different magnitudes of the circulation current depending on the SOC operating point. Thus, in this way, adaptation of the threshold to the SOC operating point is possible and a more efficient operation of the energy storage system is possible than by setting a fixed threshold.

According to one embodiment, the at least one battery state comprises at least the state of charge. A magnitude of a circulation current likely to arise upon connection of two imbalanced battery packs is strongly related to the SOC level and the SOC levels therefore provide an accurate basis for determining whether or not two battery packs may be connected.

According to one embodiment, the method further comprises:
based on at least the estimated state of charge and a measured temperature of the at least two battery packs, predicting a magnitude of a circulation current expected to flow between the at least two battery packs upon electrical connection of said at least two battery packs,
wherein controlling electrical connection of the at least two battery packs is performed based on the magnitude of the predicted circulation current. A circulation current is normally only expected to flow between unbalanced battery packs. Also an estimated state of health (SOH) of the battery packs may be taken into account for predicting the magnitude of the circulation current, in particular if a multi-battery prediction model is used to predict the circulation current. Components of the energy storage systems such as contactors, fuses etc., are normally designed for a particular current flow. By predicting the magnitude of the circulation current, it can be determined whether contactors, fuses etc. of the energy storage system will be safe, i.e., not harmed by excessive current spikes, upon connection of the battery packs.

According to one embodiment, the magnitude of the circulation current is predicted using a multi-battery prediction model. Such a multi-battery prediction model, preferably a dynamic multi-battery model, can predict information relating to a current split between the battery packs depending on the estimated difference in SOC level, SOH and temperature between the battery packs. A dynamic state-space model of a parallel multi-battery system may be used, which takes as input a total energy storage system (ESS) current, initial SOC, SOH, and temperature values of each pack, and gives as output individual battery pack currents. Such a model is scalable and configurable for any number of battery packs and takes into consideration connection resistances and ageing information in terms of capacity fade and impedance growth. It enables model-based predictions of dynamic current distribution/split among parallel battery packs in the ESS, giving the insight about the transient and steady-state responses of each individual battery unit/pack. Further, it enables understanding the dynamic interactions (i.e. circulation currents) among the battery packs under imbalances and the effect that various internal and external factors may have on the current/power splitting among the battery packs. These model-based predictions enable advanced connection control.

According to one embodiment, controlling electrical connection of the at least two battery packs comprises electrically connecting the at least two battery packs only if the magnitude of the predicted circulation current is below a predefinable allowable circulation current magnitude. This will ensure that components of the ESS are not damaged by circulation currents that they are not designed to handle.

According to one embodiment, at least a first battery pack of said at least two battery packs is already connected to the load, and at least a second battery pack of said at least two battery packs is disconnected from the load, wherein controlling electrical connection of the at least two battery packs comprises:
based on the estimated at least one battery state of at least the first and the second battery packs, determining whether the second battery pack may be connected to the load while the first battery pack remains connected to the load.

Thus, in case of two battery packs, controlling electrical connection of the battery packs comprises connecting the second battery pack so that both battery packs are connected to the load, and to each other, if it is determined that this may be done.

According to one embodiment, the at least one battery state comprises at least the open circuit voltage (OCV). The estimated OCV provides a more reliable basis for deciding whether to connect the battery packs or not than the terminal voltage, since the estimated OCV takes e.g. internal resistive losses into account. The OCV can be estimated using measured terminal voltage and estimated internal voltage losses, wherein the internal voltage losses are estimated based on measured current and estimated internal resistance. A prediction model may be used in the estimation, such as an equivalent circuit model (also referred to as a Thevenin model).

According to one embodiment, the method further comprises:
selecting a control strategy for controlling electrical connection of the at least two battery packs based on at least one of: operating conditions of the energy storage system, a usage scenario of the energy storage system, uncertainties in the estimation of the at least one battery state, and an uncertainty in a multi-battery prediction model used to predict a circulation current expected to flow between the at least two battery packs upon electrical connection of the at least two battery packs, wherein controlling electrical connection of the at least two battery packs is further performed based on the selected control strategy.

This allows adaptation of the method to the current or expected usage of the energy storage system, and improves the possibilities to make a well-founded decision on whether to connect the battery packs or not. For example, SOC or OCV thresholding may be selected as control strategies under certain conditions, while as circulation current prediction may be selected as a control strategy under other conditions. Moreover, a combined approach may be used under certain conditions, using a combination of SOC/OCV thresholding and circulation current prediction. The connection conditions may be set based on the selected control strategy. The control strategy may also be used to decide which estimations and calculations that are to be carried out.

The method according to the embodiments can be executed in several different manners. For example, the method may be performed by a control unit during use of the electrical energy storage system by an electrical propulsion system of the vehicle. The method may also be performed by different control units. For example, a battery management unit (BMU) of each battery pack may be configured to receive measurement data and estimate the at least one battery state of the respective battery pack and communicate the estimated at least one battery state to another control unit, e.g. an energy storage system (ESS) control unit. The step of controlling electrical connection of the battery packs may be performed by the ESS control unit, based on the information relating to the estimated battery states received from the BMU:s.

According to a second aspect of the present invention, there is provided a computer program comprising program code means for performing the method of any of the embodiments of the first aspect when said computer program is run on a computer. Effects and features of the second aspect of the invention are largely analogous to those described above in connection with the first aspect.

According to a third aspect of the present invention, there is provided a computer readable medium carrying a computer program comprising program means for performing the method of any of the embodiments of the first aspect when said program means is run on a computer. Effects and features of the third aspect of the invention are largely analogous to those described above in connection with the first aspect.

According to a fourth aspect of the present invention, at least the first objective is achieved by a control unit for controlling electrical connection of at least two battery packs of an energy storage system of a vehicle to a common load during operation of the vehicle, the control unit being configured to perform the method according to any one of the embodiments of the first aspect. Effects and features of the fourth aspect of the invention are largely analogous to those described above in connection with the first aspect.

According to a fifth aspect of the present invention, at least the first objective is achieved by an energy storage system of a vehicle, the energy storage system comprising:
at least two battery pack combinations connected in parallel, each battery pack combination comprising a battery pack and at least one switching device connected in series, each battery pack being connectable to a load via the at least one switching device,
at least one control unit configured to, based on measurement data relating to current operating conditions of the energy storage system, estimate at least one battery state of each one of the battery packs, wherein said at least one battery state is at least one of an open circuit voltage and a state of charge, the at least one control unit further being configured to, based on the estimated at least one battery state of each one of the battery packs, control electrical connection of each one of the battery packs via the respective at least one switching device.

The switching devices may be switching devices commonly known as battery disconnect units (BDU). They may comprise contactors, such as magnetic contactors, movable between an ON state in which the associated battery pack is connected to the load, and an OFF state in which the associated battery pack is not connected to the load. Thus, in order for two battery packs to be connected to each other, both associated contactors need to be in the ON state.

The at least one control unit may be one single control unit, but it may also be two or more control units, such as at least one control unit per battery pack and an additional control unit configured to communicate with the respective at least one control unit of each battery pack.

The load, which in itself does not form part of the energy storage system, may e.g. be an electric machine for propulsion of the vehicle or intended for another purpose, such as for driving one or more auxiliary systems of devices of the vehicle.

Other effects and features of the fifth aspect of the invention are largely analogous to those described above in connection with the first aspect. In particular, the control unit may be configured to carry out the method according to any one of the embodiments of the first aspect of the invention.

According to a sixth aspect of the present invention, there is provided a vehicle, such as a hybrid vehicle of a fully electrified vehicle, comprising an energy storage system according to the fifth aspect or a control unit according to the fourth aspect. Effects and features of the sixth aspect of the invention are largely analogous to those described above in connection with the first aspect.

The vehicle may be an electrical, hybrid, or plug-in hybrid vehicle comprising an electrical motor, wherein the energy storage system provides power to the electrical motor for providing propulsion for the vehicle. It is to be noted that the vehicle can therefore be either a partly or fully electrical vehicle.

Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

Figure 1:
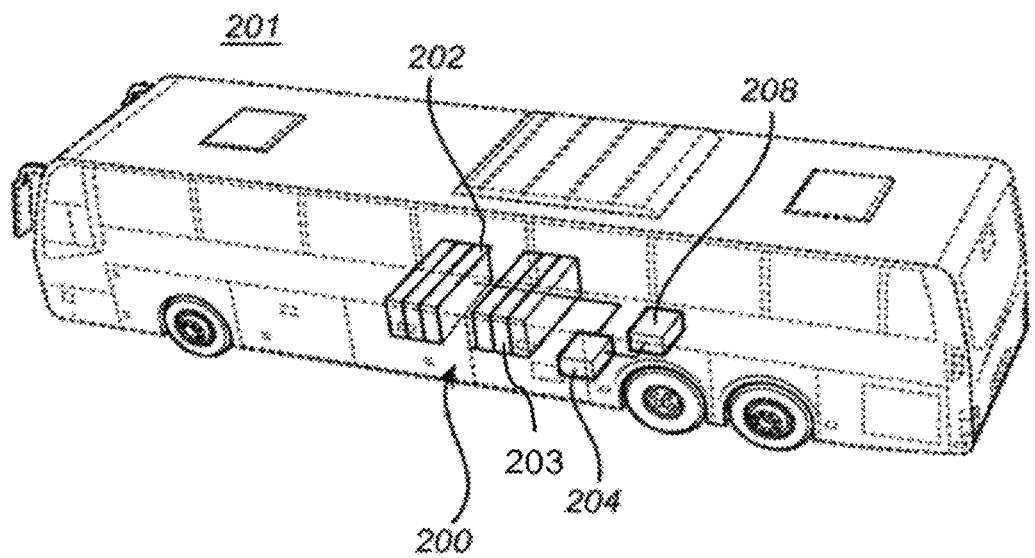
FIG. 1 shows a vehicle in which a method according to embodiments of the invention may be implemented.

In the present detailed description, various embodiments of the method according to the present invention are mainly described with reference to an all-electric bus 201 as shown in FIG. 1, comprising a propulsion system in the form of battery powered electric motors. However, it should be noted that various embodiments of the described invention are equally applicable for a wide range of hybrid and electric vehicles.

The bus 201 carries an electric energy storage system (ESS) 200 comprising a first battery pack 202 and a second battery pack 203, each battery pack comprising a plurality of battery cells. The battery cells are connected in series to provide an output DC voltage having a desired voltage level. Suitably, the battery cells are of lithium-ion type, but other types may also be used. The number of battery cells per battery pack may be in the range of 50 to 500 cells. It is to be noted that the ESS may also include more than two battery packs.

A sensor unit (not shown) may be arranged for collecting measurement data relating to operating conditions of the ESS, i.e. measuring temperature, voltage and current level of the associated battery pack 202. Measurement data from each sensor unit is transmitted to an associated battery management unit (BMU) 204, which is configured for managing the individual battery pack 202 during operation of the bus 201. The BMU 204 can also be configured for determining parameters indicating and controlling the condition or capacity of the battery pack 202, such as the state of charge (SOC), the state of health (SOH), the state of power (SOP) and the state of energy (SOE) of the battery pack 202. Herein, only one BMU 204 is shown, but as mentioned above, each battery pack preferably has its own associated BMU.

The BMU 204 is connected to and configured to communicate with an ESS control unit 208, which controls the ESS. The ESS control unit 208 may include a microprocessor, a microcontroller, a programmable digital signal processor or another programmable device. Thus, the ESS control unit 208 comprises electronic circuits and connections (not shown) as well as processing circuitry (not shown) such that the ESS control unit 208 can communicate with different parts of the bus 201 or with different control units of the bus 201. The ESS control unit 208 may comprise modules in either hardware or software, or partially in hardware or software, and communicate using known transmission buses such a CAN-bus and/or wireless communication capabilities. The processing circuitry may be a general purpose processor or a specific processor. The ESS control unit comprises a non-transitory memory for storing computer program code and data. Thus, the skilled person realizes that the ESS control unit may be embodied by many different constructions. This is also applicable to the BMU 204.

Figure 2:
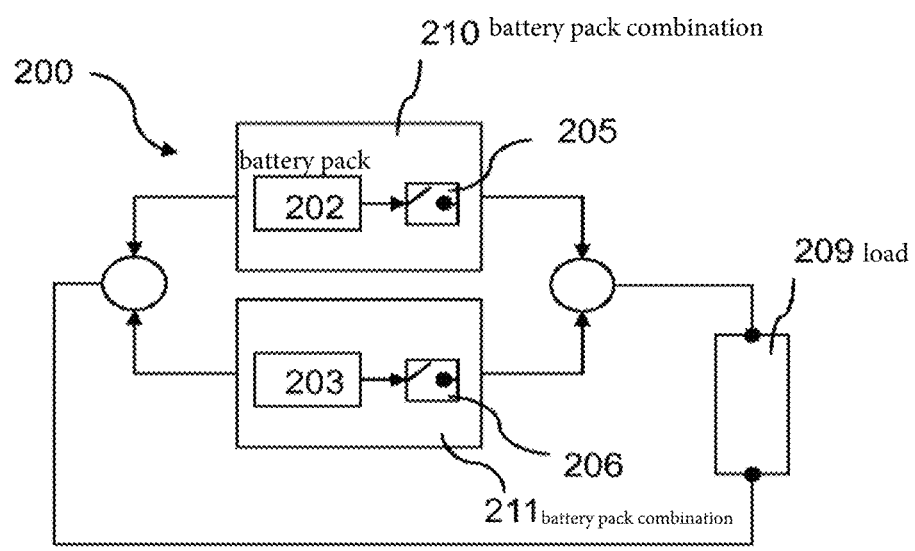
FIG. 2 shows parts of an energy storage system according to an embodiment of the invention.

Turning now to FIG. 2, a schematic diagram of parts of the ESS 200 is shown. Each of the battery packs 202, 203 of the ESS 200 form part of a respective battery pack combination 210, 211, connected in parallel to each other. Each battery pack combination 210, 211 comprises, apart from the battery pack 202, 203, a respective switching device 205, 206 connected in series with the respective battery pack 202, 203. Such switching devices may also be referred to as battery disconnect units (BDU:s). The battery packs 202, 203 are connectable to a load 209, which may e.g. be an electric machine for propulsion of the vehicle 201, via the respective switching devices 205, 206. The switching devices 205, 206 are movable between an ON state in which the respective battery pack 202, 203 is connected to the load 209, and an OFF state in which the respective battery pack 202, 203 is not connected to the load 209. In order for the two battery packs 202, 203 to be electrically connected to each other, both respective switching devices 205, 206 need to be in the ON state. One or more control unit(s) (not shown) is/are configured to communicate with the respective battery packs 202, 203 and control switching of the switching devices 205, 206.

Figure 3:
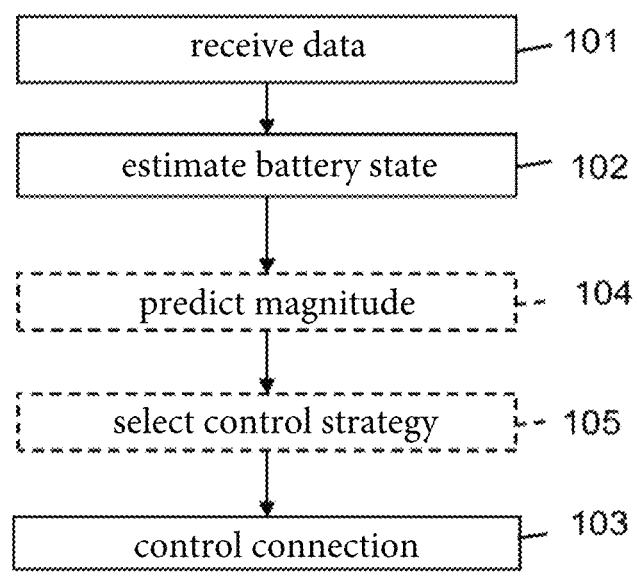
FIG. 3 is a flow chart illustrating a method according to an embodiment of the invention.

A method for controlling electrical connection of the two battery packs 202, 203 of the ESS 200 to the load 209 according to an embodiment of the invention is illustrated in the flow diagram in FIG. 3. It is to be noted that the method may of course also be used for connecting more than two battery packs. The method may be carried out by the control unit 208, but the method may also be carried out by another control unit, or different steps of the method may be carried out in different control units. For example, some steps may be carried out in the BMU:s 204.

In a first step 101, measurement data relating to current operating conditions of the energy storage system 200 are received from the sensor unit. The measurement data may include battery current I, terminal voltage V and battery temperature T of each battery pack. The measurement data may be filtered measurement data, from which noise has been removed.

In a second step 102, based on at least the received measurement data, at least one battery state of each one of the battery packs is estimated. The at least one battery state is at least one of an open circuit voltage (OCV) and a state of charge (SOC), i.e. one or both of the OCV and the SOC of the battery packs 202, 203 may be estimated. A plurality of different methods exist for estimating SOC and OCV on the basis of measurement data relating to operating conditions. For example, estimators such as non-linear estimators, e.g. some type of Kalman filters, and variants of recursive nonlinear observers, may be used. The SOC and OCV may also be estimated using optimization based estimation schemes, e.g. a moving horizon estimation, total least squares, recursive-least-squares, etc.

In a third step 103, based on the estimated at least one battery state of each one of the battery packs 202, 203, i.e. OCV and/or SOC, electrical connection of each battery pack 202, 203 to the load 209 via the respective switching devices 205, 206 is controlled. For example, a signal may be sent to the respective switching device 205, 206 that it is to be set to the ON state or to the OFF state, depending on the estimated OCV and/or SOC of the respective battery pack 202, 203.

The battery packs 202, 203 may e.g. be electrically connected only if a predetermined connection condition is considered to be fulfilled. The predetermined connection condition may for example be defined so that it is considered to be fulfilled if the estimated SOC and/or OCV of the first battery pack 202 does not differ by more than a predefined threshold from the estimated SOC and/or OCV of the second battery pack 203. If the first battery pack 202 is already connected to the load 209, the predefined threshold may be selected in dependence on a current SOC operating point of the first battery pack 202. Different thresholds may thereby be selected for different SOC operating points. A look-up table or map may be used, describing a relation between the battery state, e.g. the SOC, and a circulation current likely to arise between the battery packs 202, 203 upon connection of the second battery pack 203 to the load 209, for different SOC operating points.

In an exemplary embodiment, an optional fourth step 104 of predicting a magnitude of a circulation current expected to flow between the battery packs 202, 203 upon electrical connection of the battery packs is carried out. The prediction is based on at least the estimated SOC, as estimated in step 102, state of health (SOH), estimated based on state of resistance (SOR) and capacity (SOQ), and a measured temperature. A dynamic multi-battery prediction model may be used to predict the magnitude of the circulation current. The step 103 of controlling electrical connection of the battery packs 202, 203 may in this case be performed based on the predicted magnitude of the circulation current. For example, the connection condition may be set so that it is considered fulfilled only if the magnitude of the predicted circulation current is below a predefined allowable circulation current magnitude, i.e. a circulation current threshold.

A dynamic state-space model of a parallel multi-battery pack system, derived mainly using single battery models and exploiting parallel connection constraints, may be used as the multi-battery prediction model:

$$\dot{x}(t)=A_I(t) \cdot x(t)+B_I(t) \cdot I_{dem}(t)$$

$$y(t)=C_I(t) \cdot x(t)+D_I(t) \cdot I_{dem}(t)$$

Herein, full state of the complete ESS 200 is represented by $x=[x_1 \ldots x_n]^T$, wherein a state of each constituent battery pack $BP_i$ of the ESS is represented by $x_i=[V_{1i} \ V_{2i} \ OCV_i \ SOC]^T$, T herein denoting vector transpose. The output of the system is represented by $y=[I_{b1} \ldots I_{bn}]^T$, where $I_{bi}$ is the output current of each $BP_i$. The control input of this state-space model is the total demanded input current $I_{dem}$. The model matrices $A_I$, $B_I$, $C_I$, and $D_I$ are nonlinear functions of system parameters ($R_{0i}$, $R_{1i}$, $R_{2i}$, $C_{1i}$, $C_{2i}$, $Q_{bi}$, $KR_{i-1,i}$, $KR_i$) and system electro-thermal and ageing states ($SOC_i$, $T_{bi}$, $SOQ_i$, $SOR_i$).

To save computational power, the step 104 of predicting the circulation current may only need to be carried out if the estimation of the battery state(s) of the battery packs 202, 203, carried out in step 102, reveals that there is a non-negligible difference between the estimated values of corresponding battery states of the battery packs, e.g. if the estimated SOC of the first battery pack 202 differs significantly from the estimated SOC of the second battery pack 203.

It is also possible to perform an optional fifth step 105 of selecting a control strategy for controlling electrical connection of the battery packs 202, 203. The control strategy may be selected based on operating conditions of the ESS 200, a usage scenario of the ESS 200, uncertainties in the estimation of the at least one battery state, and an uncertainty in the multi-battery prediction model used to predict the circulation current expected to flow between the battery packs 202, 203 upon electrical connection thereof. The step 103 of controlling electrical connection of the battery packs 202, 203 may be performed based on the selected control strategy.

The control strategy may be to control the electrical connection of the battery packs 202, 203 based on SOC or OCV thresholding, or based on the magnitude of a predicted circulation current, or based on a combination of those. For example, the connection condition may be set in dependence on the control strategy.

Although the figures may show a sequence, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

The control functionality of the example embodiments may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media.

Machine-executable instructions include, for example, instructions and data which cause a general purpose computer, special purpose computer, or special purpose processing machines to perform a certain function or group of functions.

It is to be understood that the present invention is not limited to the embodiments described above and illustrated in the drawings; rather, the skilled person will recognize that many changes and modifications may be made within the scope of the appended claims.

The invention claimed is:

1. A method for controlling electrical connection of at least two battery packs of an energy storage system of a vehicle in parallel to a common load during operation of the vehicle, each one of the at least two battery packs being connectable to the load via at least one respective switching device, the method comprising:
  receiving measurement data relating to current operating conditions of the energy storage system,
  based on at least the measurement data, estimating at least one battery state of each one of the at least two battery packs, wherein said at least one battery state comprises at least one of an open circuit voltage and a state of charge,
  based on at least the estimated state of charge and a measured temperature of the at least two battery packs, predicting a magnitude of a circulation current expected to flow between the at least two battery packs upon electrical connection of said at least two battery packs, wherein the magnitude of the circulation current is predicted using a dynamic state-space model of a parallel multi-battery system, which model takes as input a total energy storage system current, initial state of charge, state of health, and temperature values of each battery pack, and gives as output individual battery pack currents including transient and steady-state responses of each individual battery pack,
  based on the magnitude of the predicted circulation current, controlling electrical connection of each battery pack to the load via the at least one respective switching device, wherein the at least two battery packs are electrically connected only if the magnitude of the predicted circulation current is below a predefinable allowable circulation current magnitude.

2. The method according to claim 1, wherein controlling electrical connection of the at least two battery packs comprises:
  based on said estimated at least one battery state of each one of the at least two battery packs, determining if a predetermined connection condition is fulfilled, wherein the at least two battery packs are only electrically connected if the connection condition is considered to be fulfilled.

3. The method according to claim 2, wherein the connection condition is considered to be fulfilled if, for connection of a first and a second battery pack of the at least two battery packs, the at least one battery state of the first battery pack does not differ by more than a predefinable threshold from the at least one battery state of the second battery pack.

4. The method according to claim 3, wherein a value of the predefinable threshold is selected in dependence on a state of charge operating point of at least one of said battery packs that is already connected to the load.

5. The method according to claim 1, wherein at least a first battery pack of said at least two battery packs is already connected to the load, and wherein at least a second battery pack of said at least two battery packs is disconnected from the load, wherein controlling electrical connection of the at least two battery packs comprises:
  based on the estimated at least one battery state of at least the first and the second battery packs, determining whether the second battery pack may be connected to the load while the first battery pack remains connected to the load.

6. The method according to claim 1, further comprising:
  selecting a control strategy for controlling electrical connection of the at least two battery packs based on at least one of: operating conditions of the energy storage system, a usage scenario of the energy storage system, uncertainties in the estimation of the at least one battery state, and an uncertainty in a multi-battery prediction model used to predict a circulation current expected to flow between the at least two battery packs upon electrical connection of the at least two battery packs, wherein controlling electrical connection of the at least two battery packs is further performed based on the selected control strategy.

7. A non-transitory computer readable medium carrying a computer program comprising program code for performing the method according to claim 1 when said program code is run on a computer.

8. A control unit for controlling electrical connection of at least two battery packs of an energy storage system of a vehicle to a common load during operation of the vehicle, the control unit being configured to perform the method according to claim 1.

9. An energy storage system of a vehicle, the energy storage system comprising:
  at least two battery pack combinations connected in parallel, each battery pack combination comprising a battery pack and at least one switching device connected in series, each battery pack being connectable to a load via the at least one switching device,
  at least one control unit configured to:
  based on measurement data relating to current operating conditions of the energy storage system, estimate at least one battery state of each one of the battery packs, wherein said at least one battery state comprises at least one of an open circuit voltage and a state of charge,
  based on at least the estimated state of charge and a measured temperature of the at least two battery packs, predict a magnitude of a circulation current expected to flow between the at least two battery packs upon electrical connection of said at least two battery packs, wherein the magnitude of the circulation current is predicted using a dynamic state-space model of a parallel multi-battery system that takes as input a total energy storage system current, initial state of charge, state of health, and temperature values of each battery pack, and gives as output individual battery pack currents including transient and steady-state responses of each individual battery pack,
  based on the magnitude of the predicted circulation current, control electrical connection of each battery pack to the load via the respective at least one switching device, wherein the at least one control unit is configured to electrically connect the battery packs only if the magnitude of the predicted circulation current is below a predefinable allowable circulation current magnitude.

10. A vehicle, such as a hybrid vehicle or a fully electrified vehicle, comprising an energy storage system according to claim 9.

* * * * *